(12) United States Patent
Ghannam et al.

(10) Patent No.: US 9,989,578 B2
(45) Date of Patent: Jun. 5, 2018

(54) SELF-WARNING SYSTEM FOR UNLOCKED CONNECTORS

(71) Applicant: FORD GLOBAL TECHNOLOGIES, LLC, Dearborn, MI (US)

(72) Inventors: Mahmoud Yousef Ghannam, Canton, MI (US); Swadad A. Carremm, Canton, MI (US); Aed M. Dudar, Canton, MI (US); Kam Hage, Troy, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 232 days.

(21) Appl. No.: 14/748,663

(22) Filed: Jun. 24, 2015

(65) Prior Publication Data

US 2016/0377668 A1 Dec. 29, 2016

(51) Int. Cl.
*G01R 31/04* (2006.01)
*G01R 31/02* (2006.01)
*H01R 13/52* (2006.01)
*H01R 13/641* (2006.01)

(52) U.S. Cl.
CPC ......... *G01R 31/043* (2013.01); *G01R 31/026* (2013.01); *H01R 13/5216* (2013.01); *H01R 13/5219* (2013.01); *H01R 13/641* (2013.01)

(58) Field of Classification Search
CPC ... G01R 31/043–31/045; G01R 31/026; H01R 13/641; H01R 13/5202; H01R 13/5205; H01R 13/5208; H01R 13/521; H01R 13/5219; H01R 13/5221; H01R 13/6272

USPC ................. 324/538; 439/188, 489, 271–275; 73/49.8
See application file for complete search history.

(56) References Cited

U.S. PATENT DOCUMENTS

| | | | | |
|---|---|---|---|---|
| 4,258,565 A | * | 3/1981 | Sawayama | G01F 1/3263 310/338 |
| 4,621,883 A | * | 11/1986 | Noguchi | H01R 13/5219 439/271 |
| 4,703,989 A | * | 11/1987 | Price | A61B 5/0215 439/283 |
| 4,874,325 A | * | 10/1989 | Bensing | H01R 13/5219 439/272 |
| 4,936,791 A | * | 6/1990 | Zielinski | H01R 13/5219 439/271 |

(Continued)

FOREIGN PATENT DOCUMENTS

JP 2006140167 A 6/2006

*Primary Examiner* — Patrick Assouad
*Assistant Examiner* — Demetrius Pretlow
(74) *Attorney, Agent, or Firm* — Frank MacKenzie; Brooks Kushman P.C.

(57) ABSTRACT

A sealing gasket for an electrical connector system includes a resilient element configured to seal an interface between a header surface and a connector surface. The sealing gasket further includes thin-film sensing elements in contact with the resilient element that are configured to define a resistance of an electrical network based on a force applied to the sealing gasket. In some configurations, the sensing elements are arranged in a series electrical network and establish a conductive path when the force is greater than a predetermined force at each of the sensing elements. The thin-film sensing elements may be coupled to a controller that is configured to output a diagnostic based on a state of the electrical network.

17 Claims, 4 Drawing Sheets

(56) References Cited

U.S. PATENT DOCUMENTS

| | | | | |
|---|---|---|---|---|
| 5,033,297 | A | * | 7/1991 | Gustafson ............... E21B 47/01 |
| | | | | 439/279 |
| 5,273,456 | A | * | 12/1993 | Muzslay .............. H01R 13/641 |
| | | | | 439/188 |
| 5,370,543 | A | | 12/1994 | Hamada et al. |
| 5,600,300 | A | | 2/1997 | Povilaitis |
| 6,062,899 | A | | 5/2000 | Presley et al. |
| 6,113,407 | A | * | 9/2000 | Martin ................. H01R 13/521 |
| | | | | 439/205 |
| 6,361,356 | B1 | | 3/2002 | Heberlein et al. |
| 7,180,227 | B2 | * | 2/2007 | Tseng .................... F16J 15/064 |
| | | | | 277/321 |
| 7,614,893 | B2 | | 11/2009 | Khodorkovsky et al. |
| 8,949,041 | B2 | * | 2/2015 | Schenk ................. F16J 15/064 |
| | | | | 277/321 |
| 2008/0193207 | A1 | * | 8/2008 | Kruse ................ F16C 11/0647 |
| | | | | 403/133 |
| 2011/0239749 | A1 | * | 10/2011 | Toth ..................... F02B 77/085 |
| | | | | 73/114.18 |
| 2014/0333035 | A1 | * | 11/2014 | Schemmann ........... F16J 15/02 |
| | | | | 277/602 |

* cited by examiner

SELF-WARNING SYSTEM FOR UNLOCKED CONNECTORS

TECHNICAL FIELD

This application generally relates to systems for detecting continuity of connections between connectors.

BACKGROUND

A vehicle includes many electronic modules and systems. For proper operation, the electronic modules are connected to one another through one or more wiring harnesses. To facilitate assembly and repair of the electronic modules in the vehicle, connectors are used to couple the wiring harnesses to the electronic modules. Some connectors include a locking mechanism that secures the wiring harness connector to the electronic module connector. During usage, the locking mechanism may become damaged and no longer function to secure the connector in place. However, in some cases, electrical contact between the conducting elements may be established. The electronic module may appear to function properly under some conditions. Under vibration or other forces, the electrical contact may become interrupted leading to intermittent or loss of function of the electronic module. Other scenarios may include connectors that visually appear to be properly seated but are not for some reason (e.g., obstruction, damaged pins).

SUMMARY

An electrical connector system includes sealing gasket disposed between a header surface and a connector surface and a plurality of thin film force sensing elements coupled with the sealing gasket, connected in a series electrical network, and configured to form a conductive path through the series electrical network in response to forces applied to predetermined locations of the sealing gasket exceeding a threshold.

The electrical connector system may further include a connector defining the connector surface, and a header configured to receive the connector and defining the header surface. The connector or the header may include one or more contacts configured to form an electrical connection to the series electrical network. The electrical connector system may include a controller electrically coupled to the contacts, and programmed to apply a predetermined voltage to the series electrical network, to measure a current through the series electrical network, and to, in response to the current through the series electrical network being less than a predetermined current, output a diagnostic code. The threshold may be an amount of force to maintain electrical contact of electrical connections between the header and the connector The conductive path may not be formed when the forces applied at any one of the predetermined locations is less than the threshold. The predetermined locations may correspond to locations of the sensing elements. A resistance associated with the conductive path may change as the forces change. In response to the forces being greater than the threshold, the resistance may be less than a predetermined resistance.

An electrical connector sealing gasket includes a resilient element configured to seal an interface between a header surface and a connector surface and a thin film including a plurality of force sensing elements in contact with the resilient element and configured to define an electrical network having a resistance that is defined by a compression force applied to the sealing gasket. The force sensing elements may be arranged at a plurality of predetermined locations.

The electrical connector sealing gasket may include a second resilient element wherein the thin film is disposed between the resilient elements. The electrical connector sealing gasket may include one or more electrical contacts configured to form an electrical connection between the electrical network and a controller. The resistance of the electrical network may be less than a predetermined resistance when the compression force at each of the predetermined locations is greater than a predetermined force. The electrical network may form a conductive path through the thin film in response to the compression force being greater than a predetermined force at each of the predetermined locations. The resistance of the electrical network may be greater than a predetermined resistance when the compression force at any of the predetermined locations is less than a predetermined force. The resilient element may include one or more locator elements protruding from the resilient element configured to cooperate with recesses in one or more of the header surface and the connector surface to position the electrical connector sealing gasket.

An electrical connector system includes a sealing gasket disposed between a header surface and a connector surface. The electrical connector system further includes a plurality of thin film force sensing elements coupled to and arranged at predetermined locations of the sealing gasket, and configured to change resistance in response to changes in forces applied at each of the predetermined locations.

The sensing elements may be electrically coupled in a series electrical network such that, in response to the forces being greater than a predetermined force at each of the predetermined locations, a total resistance of the series electrical network may be less than a predetermined resistance. In response to the forces being less than a predetermined force at any of the predetermined locations, a total resistance of the series electrical network may be greater than a predetermined resistance.

The electrical connector system may include a connector defining the connector surface, and a header configured to receive the connector and defining the header surface, and at least one electrical contact electrically coupled to the thin film force sensing elements and configured to form an electrical connection with contacts of the header or the connector. The electrical connector system may include a controller programmed to apply a predetermined voltage to the thin film force sensing elements, to measure a current through the thin film force sensing elements, and to, in response to the current through any of the thin film force sensing elements being less than a predetermined current, output a diagnostic code.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
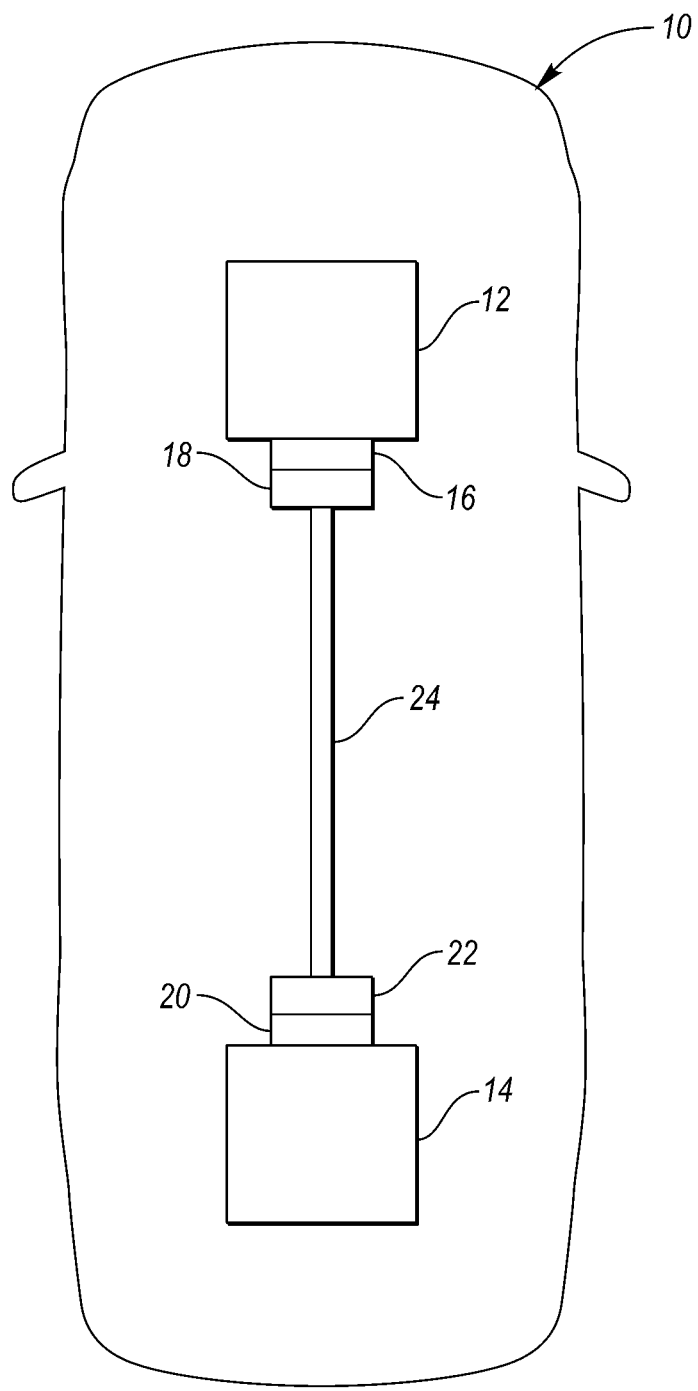
FIG. 1 depicts a possible connection of two electronic modules in a vehicle.

FIG. 1 depicts an example vehicle 10 that includes a first electronic module 12 and a second electronic module 14. Although only two electronic modules are depicted, the vehicle 10 may include more than two electronic modules. The electronic modules 12, 14 may perform a variety of functions in the vehicle 10. For example, operation of an engine or transmission may be controlled by one of electronic modules to maximize performance and fuel economy. Further examples of electronic modules in a vehicle include a Restraint Control Module (RCM), a Powertrain Control Module (PCM), and a Body Control Module (BCM).

The exchange of signals throughout the vehicle may be facilitated by one or more wiring harnesses 24. In addition to signals, power and ground connections may be routed through the wiring harness 24. The wiring harness 24 may include conductors that create an electrical connection between various points of the electrical system. In the example depicted, the conductors may terminate into a first harness connector 18 and a second harness connector 22. Although the wiring harness 24 is depicted routing conductors between the first harness connector 18 and the second harness connector 22, the wiring harness 24 may include conductors that terminate at other electronic modules or systems.

The electronic modules 12, 14 may be configured to exchange signals with one another. The first electronic module 12 may include a first receptacle or header 16 configured to receive a first harness connector 18. The second electronic module 14 may include a second receptacle or header 20 configured to receive a second harness connector 22. The wiring harness 24 may couple contacts of the first harness connector 18 to contacts of the second harness connector 22. The wiring harness 24 may include signals that are derived from other electronic modules or signal sources within the vehicle 10.

Figure 2A:
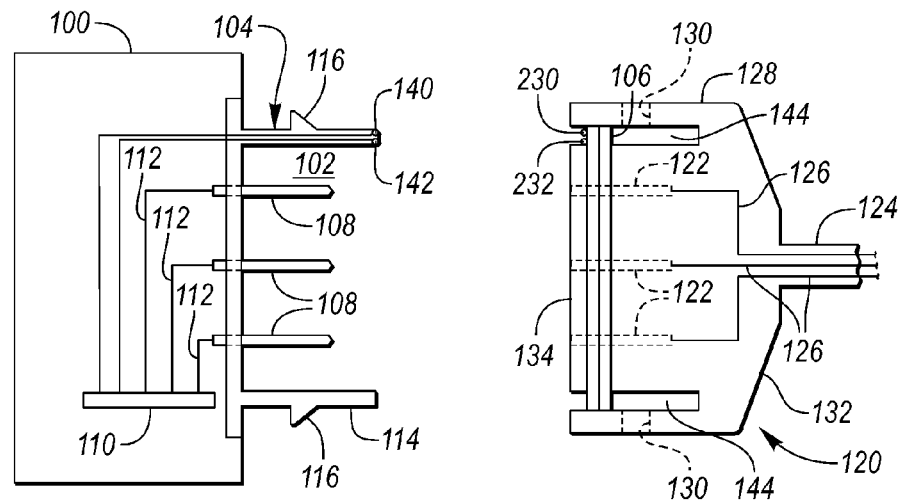
FIG. 2A depicts a top view of a possible connector system in a disconnected state.
Figure 2B:
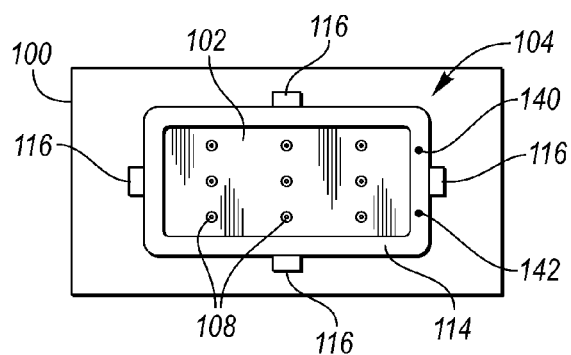
FIG. 2B depicts a front view of a header.
Figure 2C:
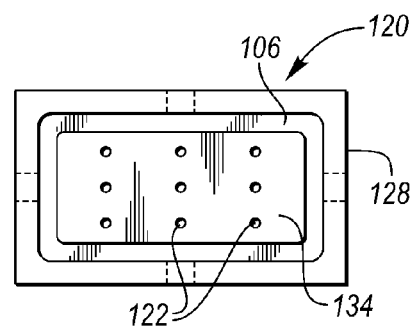
FIG. 2C depicts a front view of a connector.
Figure 3:
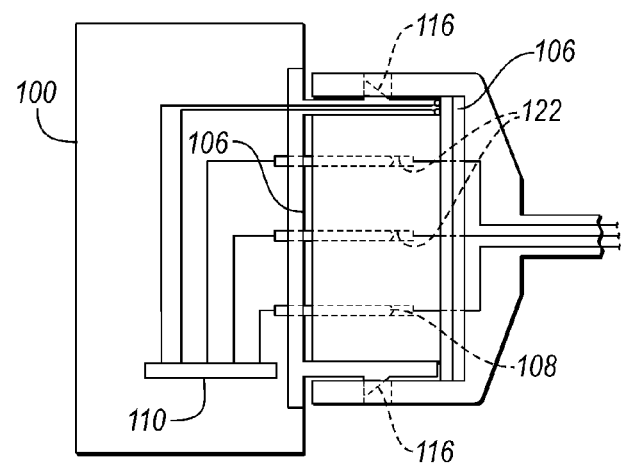
FIG. 3 depicts a top view of a possible connector system in a connected state.

FIG. 2A depicts one possible view of a connector system for an electronic module that includes a connector header 104 configured to receive a harness connector 120. The harness connector 120 and the header 104 shown if FIG. 2A are in an unconnected position. FIG. 2B depicts a possible front view of the header 104 and FIG. 2C depicts a possible front view of the harness connector 120. FIG. 3 depicts a view of the connector system when the header 104 and the harness connector 120 are in a connected position.

The electronic module may include a housing 100 that is configured to contain and shelter associated electronic components. The connector header 104 may be comprised of a header outer wall 114 extending from the housing 100 to define a cavity 102 for a plurality of pins 108. The header outer wall 114 of the connector header 104 may also be configured to facilitate connection with the harness connector 120. The header outer wall 114 may include one or more sloped protrusions 116 configured to for securing the harness connector 120 to the connector header 104. In the example depicted, the header outer wall 114 may form a generally rectangular cavity 102. The shape formed by the header outer wall 114 is not limited to the shape depicted and other shapes are applicable to the connector system described herein.

The pins 108 may be conductive elements that extend from a bottom surface of the connector header 104 into the cavity 102. The pins 108 may be configured to be received by associated conductive recesses 122 within the harness connector 120. The pins 108 may be coupled to conductive elements 112 configured to electrically connect the pins 108 to a controller 110 or other electrical or electronic circuitry. In the connected position, the pins 108 and associated recesses 122 of the harness connector may be in electrical contact to form a conductive path.

The harness connector 120 may include a shell 132 configured to conceal and shelter the wiring harness connections. The harness connector 120 may include a connection receptacle 134 that is configured with a plurality of recesses 122 configured in a pattern to match the locations of the pins 108 of the connector header 104. The harness connector 120 may include a harness outer wall 128 configured to fit around the header outer wall 114. The harness outer wall 128 and the connection receptacle 134 may form a channel 144 around the connection receptacle 134 that is configured to receive the outer wall 128 of the connector header 104. The harness outer wall 128 may include one or more openings or notches 130 that are configured to cooperate with the sloped protrusions 116 of the connector header 104 to secure the harness connector 120 to the connector header 104. The channel 144 may be further sized and configured to receive a sealing gasket 106. The sealing gasket 106 may be fitted into the channel 144 to seal the interface between the connector header 104 and the harness connector 120.

The connector system may be configured to create a sealed interface that prevents contaminants from reaching the pins 108 and recesses 122 that form the electrical connections. The sealing may be accomplished with the sealing ring or gasket 106. The sealing gasket 106 may be constructed of a resilient material. The sealing gasket 106 may be configured to be placed in the harness connector 120 or the header 104. The sealing gasket 106 may function by filling a space between surfaces of the harness connector 120 and surfaces of the connector header 104. As a locking force is applied that moves the harness connector 120 and the connector header 104 into closer contact, the sealing gasket 106 may compress to fill any gaps between the surfaces. The sealing gasket 106 may form a continuous surface that defines an opening to receive the connection receptacle 134.

In the configuration depicted, when the connector harness 120 is moved toward the header 104, the sealing gasket 106 is moved in the channel 144. In a fully engaged position, the sealing gasket 106 may be in contact with a surface of the connector header 104 and with a surface of the harness connector 120. In the configuration shown, the surface of the harness connector 120 is within the channel 144 and the surface of the connector header 104 is a surface of the header outer wall 114.

The sealing gasket 106 may be configured to contact a header surface and a harness connector surface when the harness connector 120 is fully engaged with the header 104. When a sufficient force is applied, the connection interface between the header and the harness connector may be sealed thereby preventing moisture and other contaminants from affecting the electrical connections.

The harness connector 120 may include a latching element configured to secure or lock the harness connector to the receptacle. The latching mechanism depicted is the sloped protrusions 116 of the header 104 and notches 130 of the harness connector 120. The sealing gasket 106 disclosed herein may be applicable to any latching mechanism. In some configurations, the latching element may be a member that is pivotally coupled to the shell 132 of the harness connector 120. When the harness connector 120 is mated to the header 104, the latching element may be pivoted to a locked position. The header 104 may include one or more protrusions configured to prevent the latching element from pivoting when in the locked position. As the latching element is pivoted toward the locked position, the harness connector 120 may move toward the header 104. This movement causes the connector contacts 122 of the harness connector 120 and the header contacts 108 of the header 104 to physically contact one another. This physical contact creates a path for the electrical signals to flow between the controller 110 and the wiring harness 124. In some configurations, the latching element may be part of the header 104. In the locked position, the sealing gasket 106 may seal the interface between the connector header 104 and the harness connector 120.

Although the figures depict a connector header 104 with pins 108 and a harness connector 120 with conductive recesses 122, the configuration may be reversed. For example, the connector header may have conductive recesses and the harness connector may have pins. Further, the placement of the sealing gasket 106 may be different in some configurations. The sealing gasket 106 disclosed herein may be applicable to any type of connector system in which a sealing gasket is utilized.

Regardless of the particular configuration of the latching element, the coupling of the harness connector 120 to the connector header 104 may be insufficient to ensure proper electrical contact of the pins 108 and the recesses 122. For example, the latching element may not be completely secured by the protrusions 116 due to the notches 130 being misaligned or broken. Sufficient force may not have been applied to cause all of the notches 130 and the sloped protrusions 116 to engage with one another. As another example, the sloped protrusions 116 may be damaged or missing as to prevent retention in the locked position. In other examples, there may be an obstruction between the harness connector 120 and the connector header 104 that prevents movement to the locked position. Further, bent pins or contacts may obstruct movement toward the locked position. When the harness connector 120 is not adequately latched in the locked position, there is a risk that the contacts do not achieve stable physical contact. In some situations, the physical contact between the contacts may be intermittent.

The result of intermittent or no physical contact between the pins 108 and recesses 122 is that proper vehicle operation may be compromised. In some cases, the electrical signals may be monitored and the problem may be detected so that a warning lamp may be issued. In other cases, the intermittent operation may lead to improper operation that is not reliably detected. The risk of these connection issues may increase after servicing of the vehicle. During service, harness connectors 120 may be disconnected and reconnected. If a problem occurs during reconnection, it may be desirable to identify the issue before returning the vehicle to the customer. For example, a loose connection may not be identified until after the vehicle is returned to the customer. This may lead to the customer having to return the vehicle for service leading to customer dissatisfaction with the service. A means of identifying properly coupled harness connectors 120 and connector headers 104 may improve assembly and service of the vehicle.

Figure 4A:
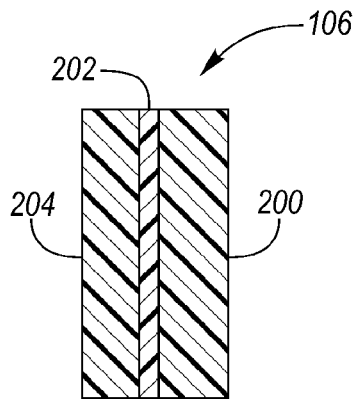
FIG. 4A is a side view of a possible sealing ring configuration.
Figure 4B:
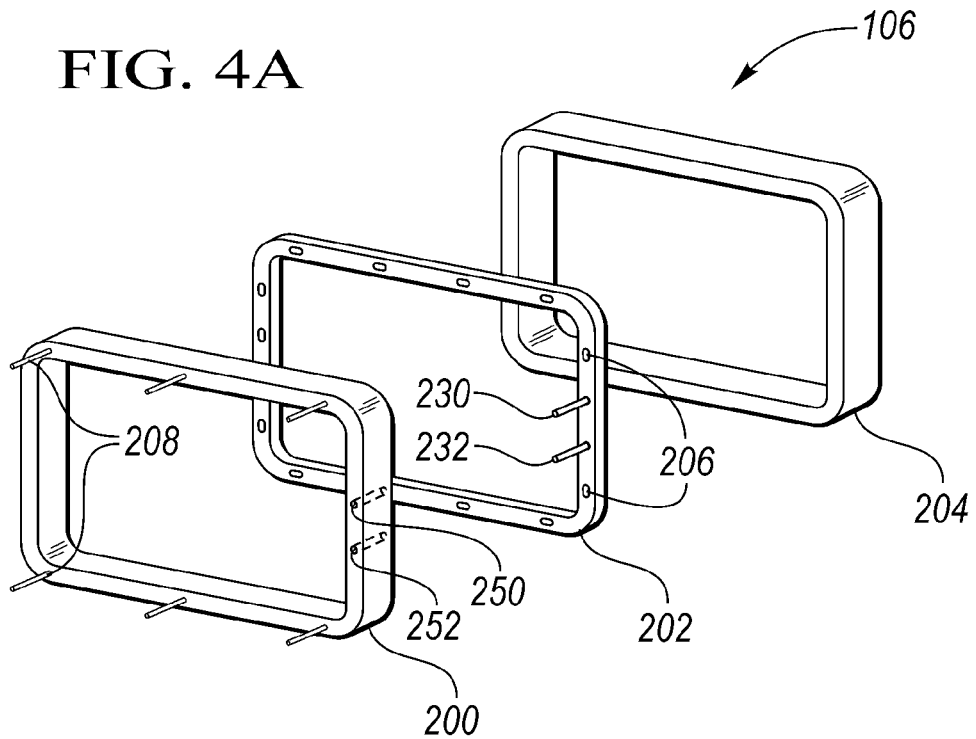
FIG. 4B is an alternate view of a possible construction of the sealing ring.

To detect a properly installed harness connector 120, a sensing device may be incorporated into the sealing gasket 106. A possible configuration for the sealing gasket 106 is depicted in FIGS. 4A and 4B. A thin-film sensing device 202 may be incorporated with the sealing gasket 106 to detect the sufficiency of the locking force securing the harness connector 120 to the connector header 104. The thin-film sensing device 202 may include multiple thin-film sensing elements 206 that are located at various positions of the thin-film sensing device 202.

The connector header 104 may include a first header contact point 140 and a second header contact point 142 configured to make electrical contact with a first circuit contact point 230 and second circuit contact point 232 of the thin-film sensing device 202. The first header contact point 140 and the second header contact point may be electrically coupled to the controller 110.

The thin-film sensing device 202 may include force sensing elements 206 that provide a signal that changes as pressure or strain acting on the sensing elements 206 varies. A resistance and/or capacitance of the thin-film sensing element 206 may vary as the force applied to the sensing element 206 varies. The force sensing elements 206 may be a strain gauge type of sensor in which deflections of the force sensing elements 206 cause a change in resistance.

The thin-film sensing device 202 may include electrically conductive traces that connect the thin-film sensing elements 206 in a circuit. The electrically conductive traces may create a series electrical connection of the sensing elements 206. In some configurations, the electrically conductive paths may be in parallel such that each of the sensing elements 206 may be coupled to a separate circuit. The traces may be configured to connect the sensing elements 206 in circuit arrangement that is series, parallel or some combination thereof.

The thin-film sensing device 202 may be configured to be an integral part of the sealing element 106. The thin-film sensing device 202 may be sized and shaped to match the sealing element 106. The sensing device 202 may be layered between a first sealing layer 200 and a second sealing layer 204. The first sealing layer 200 and the second sealing layer 204 may be formed of a resilient material. The sensing device 202 may be coupled or bonded to the first sealing layer 200 and/or the second sealing layer 204. In some configurations, the first sealing layer 200 and the second sealing layer may be constructed of different materials. In some configurations, the first sealing layer 200 and the second sealing layer 204 may completely surround the thin-film sensing device 202 such that the thin-film sensing element 202 is completely enclosed in resilient material. In some configurations, the thin-film sensing device 202 may be coupled only to the first sealing layer 200.

The thin-film sensing device 202 may include a first circuit contact point 230 and a second circuit contact point 232. The circuit contact points 230, 232 may be configured to connect the circuit formed by the sensing elements 206 to an external device. The circuit contact points 230, 232 may be configured as pins extending from the thin-film sensing device 202. In the configuration depicted there are two circuit contact points 230, 232 but other configurations may include additional contact points. In some configurations, the circuit contact points 230, 232 may be configured to be electrically coupled to the first header contact point 140 and the second header contact point 142. In some configurations, the header contact points 140, 142 may be conductive recesses configured to receive the circuit contact points 230, 232.

The first sealing layer 200 may be configured with one or more channels 250, 252 configured to allow passage of the circuit contact points 230, 232 through the first sealing layer 200. In some configurations, the conductive channels may be alternatively routed through the second sealing layer 204. In alternative configurations, the circuit contact points 230, 232 may be conductive traces on a surface of the thin-file sensing device 202. A conductive element may be inserted into the channels 250, 252 to establish a conductive connection between the circuit contact points 230, 232 and the header contact points 140, 142.

For example, the first sealing layer 200 may be oriented to contact the connector header 104. The second sealing layer 204 may be oriented to contact a surface of the harness connector 120. In some configurations, conductive elements may be routed through the first sealing layer 200 or the second sealing layer 204 to establish electrical contact between the sensing device 202 and the connector header 104 or the harness connector 120. In some configurations, the thin-film sensing device 202 may include electrically conductive protrusions oriented into the cavity 102 defined by the connector header 104. The protrusions may be configured to contact conductive elements 140, 142 coupled to the connector header 104 or the harness connector 120.

The first sealing layer 200 and/or the second sealing layer 204 may include one or more locator elements 208 for aiding in assembly and installation. In the configuration depicted, the locator elements 208 are coupled to the first sealing layer 200 and may extend toward the connector header 104. A surface of the connector header 104 may define openings that are located and configured to receive the locator elements 208 as the sealing gasket 106 is moved toward the connector header 104. The locator elements 208 may act to guide the sealing gasket 106 into a proper position adjacent the connector header surface. In some configurations, the locator elements 208 may be coupled to the second sealing layer 204 and extend toward the harness connector 120. A surface of the harness connector 120 may define openings to receive the locator elements 208.

Figure 5A:
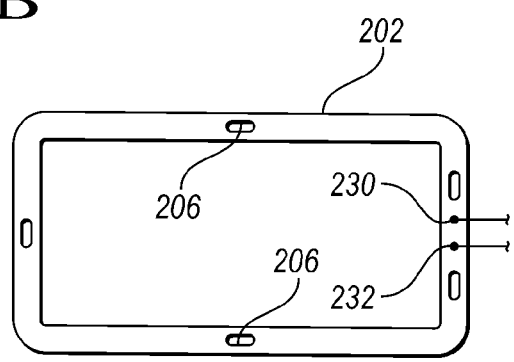
FIG. 5A is a view of a thin-film sensing device used for the sealing ring.
Figure 5B:
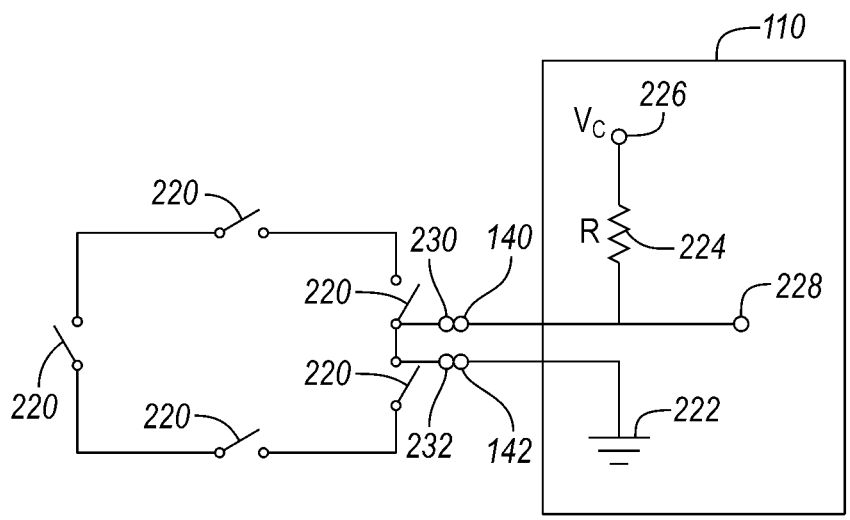
FIG. 5B is a possible electrical schematic representing the thin-film sensing device.

FIG. 5A depicts a possible configuration for the thin-film sensing device 202. FIG. 5A depicts possible locations of the thin-film sensing elements 206 around the thin-film sensing device 202. FIG. 5B depicts a corresponding electrical representation of the sensing device 202 in which the sensing elements 206 are represented as switch elements 220. In some configurations, the thin-film sensing device 202 may be a sequence of thin-film sensing elements 206 electrically connected in series to form a series electrical network. The thin-film sensing elements 206 may be represented by switch elements 220. The switch elements 220 may be in an open state when the harness connector 120 is not fully engaged. The switch elements 220 may be in a closed state when the harness connector 120 is engaged with the header 104 with at least a predetermined amount of force. In this configuration, the sensing elements 206 may be positioned about the periphery of the sealing element 106.

The controller 110 may include a connection to a power source 226. The power source 226 may be coupled to the series electrical network through a resistor 224. The series electrical network may be coupled to the power source 226 through an electrical connection established by coupling the first circuit contact point 230 to the first header contact point 140. The controller 110 may include a connection to a ground reference 222. The ground reference 222 may be coupled to the series electrical network through an electrical connection established by coupling the second circuit contact point 232 to the second header contact point 142. The resistor 224 may be selected to limit a current flow through the series electrical circuit when all of the switching elements 206 are closed. The controller 110 may be configured to measure a voltage or current of the series electrical network. The controller 110 may include an analog-to-digital converter and circuitry for scaling and filtering the voltage or current signal. For example, a voltage measurement point 228 may be selected as the voltage at the first header contact point 140. The controller 110 may also be configured to measure a voltage of the power source 226. A current flowing through the resistance 224 may be computed based on a voltage difference between the power source 226 and the voltage measurement point 228. The current may be computed as the voltage difference divided by the resistance value of the resistor 224.

In the configuration described using switching elements 220, the voltage of the first header contact point 140 may be monitored by the controller 110. When any one of the switching elements 206 is open, the controller 110 may read a voltage that is the voltage of the power source 226. That is, when any one of the switching elements 206 is in an opened state, the current flowing through the circuit may be zero. When all of the switching elements 220 are closed, the controller 110 may read a voltage that is the ground reference 222.

Figure 5C:
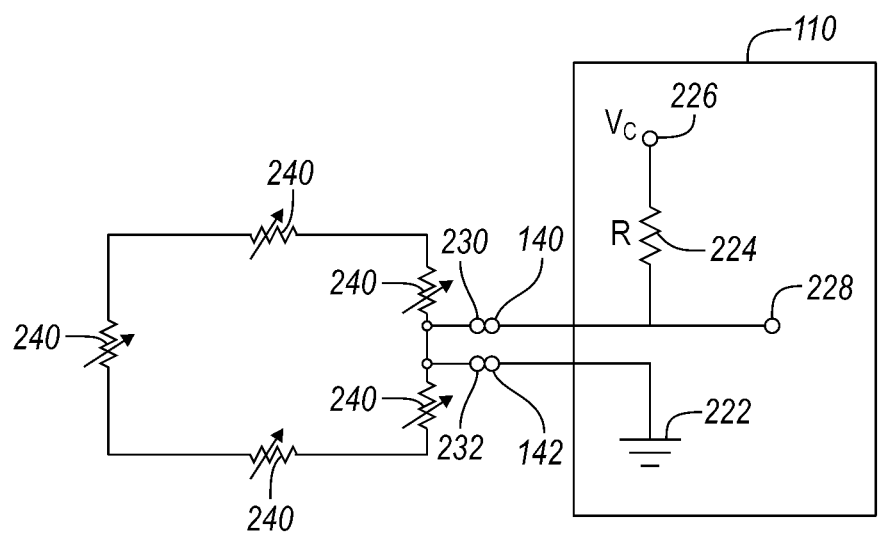
FIG. 5C is an alternate electrical schematic representing the thin-film sensing device.

FIG. 5C depicts another possible electrical representation of the thin-film sensing device 202 in which the sensing elements are represented as variable resistance elements 240. The variable resistance elements 240 may be electrically connected to form a series electrical network. The variable resistance elements 240 may have a high-resistance when the harness connector 120 is disengaged. In the disengaged state, there may be a small current flowing through the circuit. The voltage at the measurement point 228 may be near the voltage of the power source 226. As the harness connector 120 is connected with a higher force, the variable resistance elements 240 may decrease in resistance and the current through the circuit may increase. In the locked position, the variable resistance elements 240 may have little to no resistance such that a current flows through the circuit limited by the resistance 224 of the controller 110. In the fully connected state, the voltage at the measurement point 228 may be closer to the voltage of the ground reference 222. The voltage at the measurement point 228 may be determined by a voltage divider network defined by the resistance 224 and the combined resistance of the sensing elements 240. When the harness connector 120 is fully disengaged from the connector header 104, the voltage at the measurement point 228 may be the voltage of the power source 226.

In some configurations, the circuit may be configured to measure a first voltage when the harness connector 120 is disconnected and a second voltage when the harness connector 120 is connected. The voltage difference may be a function of the expected resistance values when the harness connector 120 is connected and disconnected.

A thickness of the sealing gasket 106 may be selected to provide a predetermined deflection of the sensing elements 206 when a predetermined amount of force is applied to the sealing gasket 106. When the harness connector 120 and the connector header 104 move closer together, the sealing gasket 106 may compress. At the locked position, a predetermined compression force may be applied to the sealing gasket 106. The predetermined compression force may be such that all of the sensing elements 206 in the thin-film sensing device 202 are closed to complete the electrical circuit. The predetermined compression force may be selected to permit for some variation in the locking force.

The controller 110 may monitor the voltage at the voltage measurement point 228 to determine if the predetermined compression force is applied at the connector interface. If the voltage is not within a predetermined range of voltages that are indicative of the predetermined compression force, the controller 110 may store a diagnostic indicator. The diagnostic indicator may trigger a warning lamp in the vehicle. The diagnostic indicator may also trigger storage of the diagnostic condition in non-volatile memory for later retrieval by a diagnostic tool. The diagnostic indicator may provide an indication of the particular connection that is affected.

Integrating the thin-film sensing device 202 into a sealing gasket 106 provides several benefits. Since thin-film technology is utilized, the width of the sealing gasket 106 is minimally affected. The thin-film sensing elements 206 are located at the sealing interface and can provide an accurate indication of the effectiveness of the seal and the electrical connection. The thin-film sensing device 202 may be easily integrated with existing sealing gaskets and connector interfaces. The sensing device 202 can diagnose the cause of intermittent connections of a connector system by indicating which connector is affected.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. An electrical connector system comprising:
   a connector defining a connector surface;
   a header configured to receive the connector and defining a header surface;
   a sealing gasket disposed between the header surface and the connector surface; and
   a plurality of thin film force sensing elements coupled with the sealing gasket, connected in a series electrical network, and configured to form a conductive path through the series electrical network in response to forces applied to predetermined locations of the sealing gasket exceeding a threshold that is an amount of force to maintain electrical contact of electrical connections between the header and the connector.

2. The electrical connector system of claim 1 wherein the connector or the header includes one or more contacts configured to form an electrical connection to the series electrical network.

3. The electrical connector system of claim 2 further comprising a controller electrically coupled to the contacts, and programmed to apply a predetermined voltage to the series electrical network, to measure a current through the series electrical network, and to, in response to the current through the series electrical network being less than a predetermined current, output a diagnostic code.

4. The electrical connector system of claim 1 wherein the conductive path is not formed when the forces applied at any one of the predetermined locations is less than the threshold.

5. The electrical connector system of claim 1 wherein the predetermined locations correspond to locations of the sensing elements.

6. The electrical connector system of claim 1 wherein a resistance associated with the conductive path changes as the forces change.

7. The electrical connector system of claim 6 wherein, in response to the forces being greater than the threshold, the resistance is less than a predetermined resistance.

8. An electrical connector sealing gasket comprising:
   a first resilient element configured to seal an interface between a header surface and a connector surface;
   a second resilient element; and
   a thin film including a plurality of force sensing elements in contact with and disposed between the resilient elements and configured to define a series electrical network having a resistance that is defined by a compression force applied to the sealing gasket.

9. The electrical connector sealing gasket of claim 8 further comprising one or more electrical contacts configured to form an electrical connection between the electrical network and a controller.

10. The electrical connector sealing gasket of claim 8 wherein the force sensing elements are arranged at a plurality of predetermined locations and the resistance of the electrical network is less than a predetermined resistance when the compression force at each of the predetermined locations is greater than a predetermined force.

11. The electrical connector sealing gasket of claim 8 wherein the force sensing elements are arranged at a plurality of predetermined locations and the electrical network forms a conductive path through the thin film in response to the compression force being greater than a predetermined force at each of the predetermined locations.

12. The electrical connector sealing gasket of claim 8 wherein the force sensing elements are arranged at a plurality of predetermined locations and the resistance of the electrical network is greater than a predetermined resistance when the compression force at any of the predetermined locations is less than a predetermined force.

13. The electrical connector sealing gasket of claim 8 wherein the resilient element includes one or more locator elements protruding from the resilient element configured to cooperate with recesses in one or more of the header surface and the connector surface to position the electrical connector sealing gasket.

14. An electrical connector system comprising:
a sealing gasket disposed between a header surface and a connector surface; and
a plurality of thin film force sensing elements coupled to and arranged at predetermined locations of the sealing gasket and electrically coupled in a series electrical network, and configured to change resistance in response to changes in forces applied at each of the predetermined locations such that, in response to the forces being greater than a predetermined force at each of the predetermined locations, a total resistance of the series electrical network is less than a predetermined resistance.

15. The electrical connector system of claim 14 wherein the sensing elements are electrically coupled in a series electrical network such that, in response to the forces being less than a predetermined force at any of the predetermined locations, a total resistance of the series electrical network is greater than a predetermined resistance.

16. The electrical connector system of claim 14 further comprising a connector defining the connector surface, and a header configured to receive the connector and defining the header surface, and at least one electrical contact electrically coupled to the thin film force sensing elements and configured to form an electrical connection with contacts of the header or the connector.

17. The electrical connector system of claim 16 further comprising a controller programmed to apply a predetermined voltage to the thin film force sensing elements, to measure a current through the thin film force sensing elements, and to, in response to the current through any of the thin film force sensing elements being less than a predetermined current, output a diagnostic code.

* * * * *